United States Patent [19]
Cantrell

[11] Patent Number: 5,172,306
[45] Date of Patent: Dec. 15, 1992

[54] ADAPTIVE CARD MOUNTING SYSTEM

[75] Inventor: Gregory A. Cantrell, Mesquite, Tex.

[73] Assignee: E-Systems, Inc., Dallas, Tex.

[21] Appl. No.: 678,102

[22] Filed: Apr. 1, 1991

[51] Int. Cl.⁵ ............................................. H05K 7/14
[52] U.S. Cl. .................................... 361/415; 211/41; 439/61; 439/62
[58] Field of Search ............... 361/412, 413, 415, 395, 361/391; 439/61, 64, 377, 62; 211/412; 312/9, 15, 18

[56] References Cited

U.S. PATENT DOCUMENTS

| | | | |
|---|---|---|---|
| 3,878,438 | 4/1975 | Weisman | 361/415 |
| 4,235,490 | 11/1980 | Schwartz et al. | 211/41 X |
| 4,462,499 | 7/1984 | Calabro | 361/399 |
| 4,498,123 | 2/1985 | Fuss et al. | 361/391 X |
| 4,866,576 | 9/1989 | Umetsu et al. | 211/41 X |
| 5,008,778 | 4/1991 | Peyerl | 361/415 |

Primary Examiner—Leo P. Picard
Assistant Examiner—D. Sparks
Attorney, Agent, or Firm—Harold E. Meier

[57] ABSTRACT

An adaptable card mounting system includes a number of card guides having predefined configurations selectively mounted at slot locations within a chassis to enable cards of varying dimensions to be installed. A first type of card guide is mounted to opposed walls of the chassis at each slot location. This first card guide is required for installation of cards of a first length and first depth. A second card guide is mounted to the walls of the chassis in conjunction with the first card guide at slot locations requiring installation of circuit cards having a second depth different than that of the first depth. A third type of card guide is mounted between the opposed first or second card guides at selected slot locations requiring installation of cards of a second length shorter than the first length. Use of the three card guides at selected slot locations permits installation of circuit cards of varying dimensions independent of slot location. The chassis is therefore adaptable to modifications in the circuit design on the supported cards that require changing the number or shape of the included cards.

25 Claims, 6 Drawing Sheets

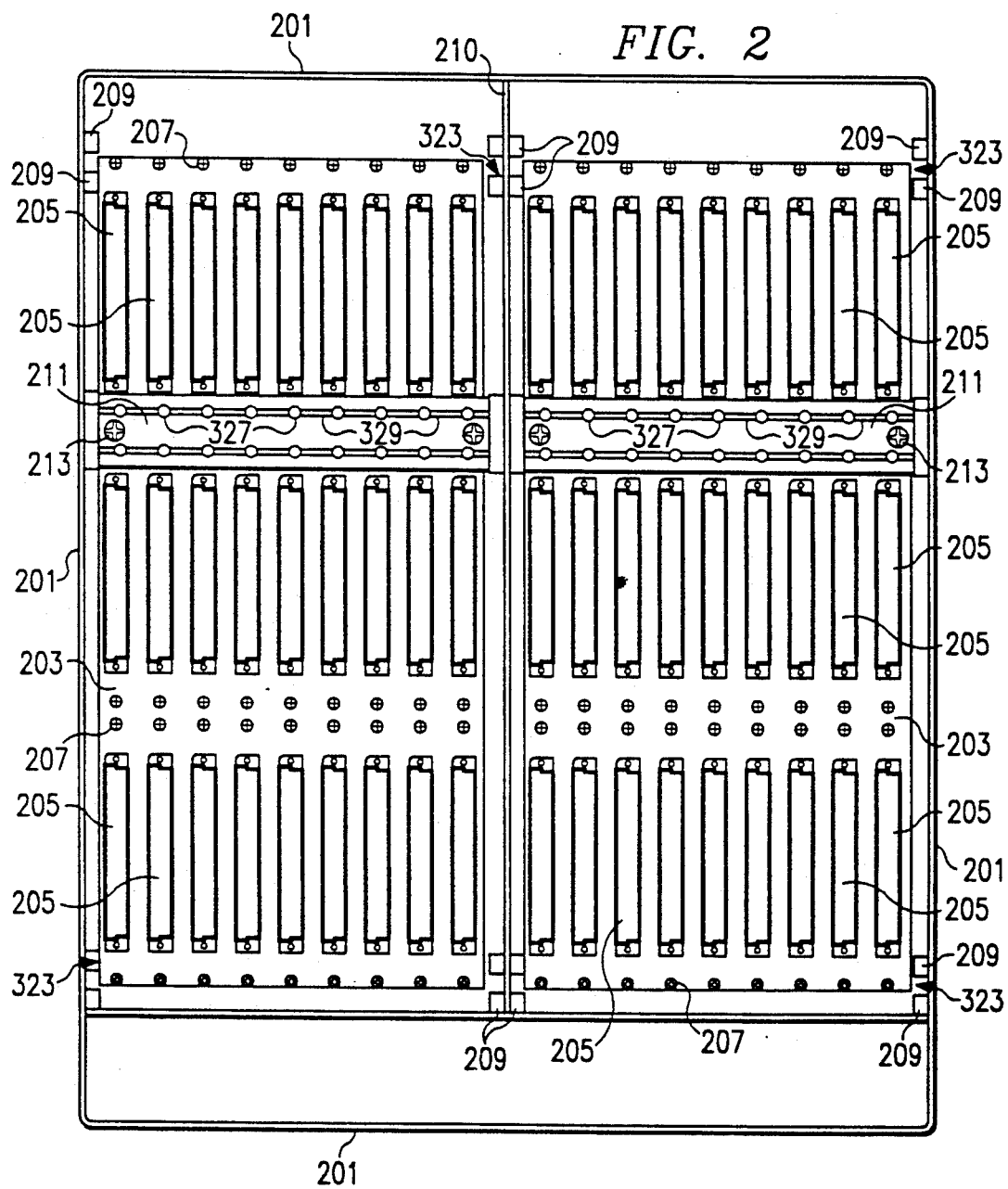

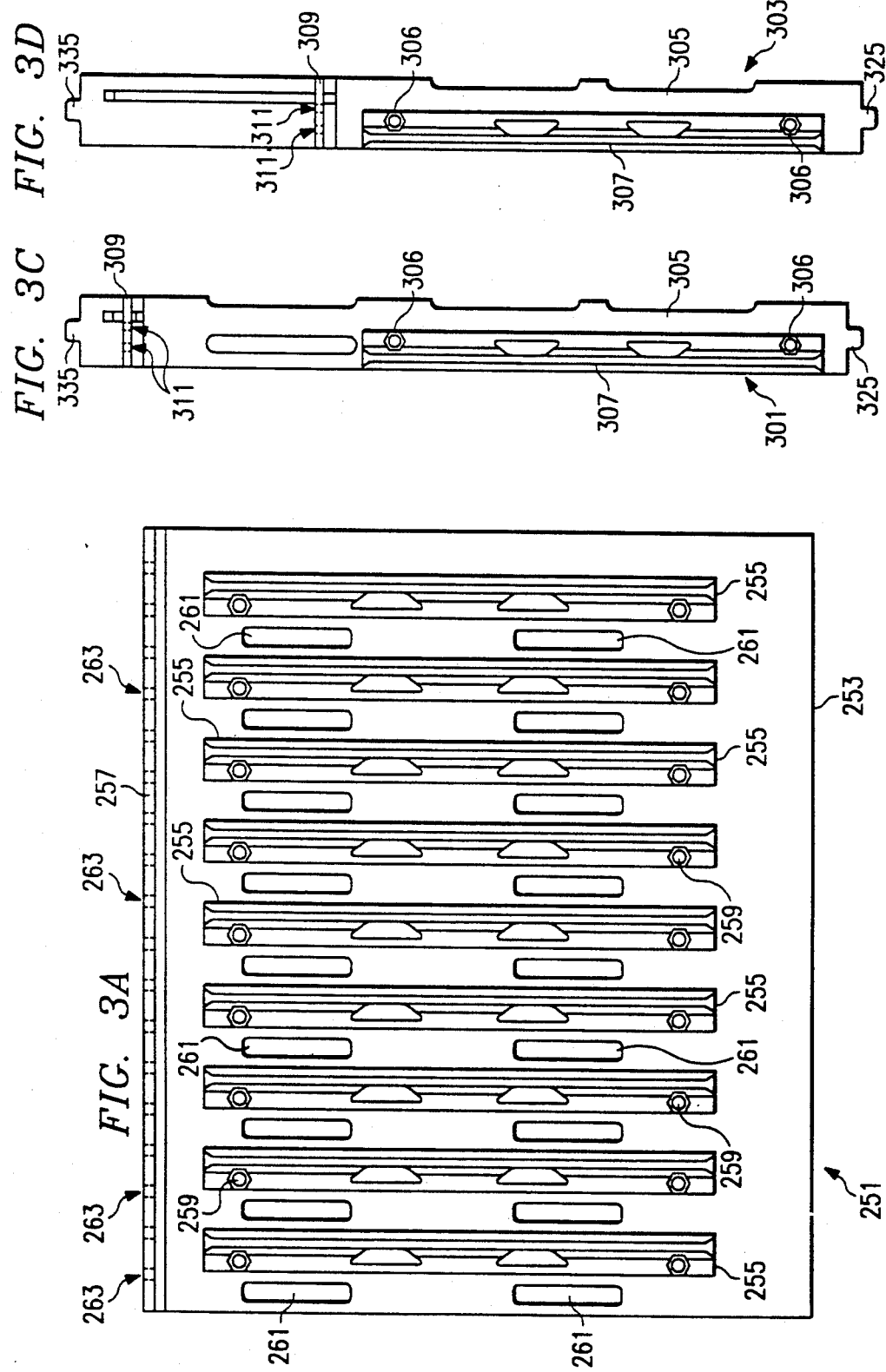

ADAPTIVE CARD MOUNTING SYSTEM

TECHNICAL FIELD

This invention relates to a card mounting enclosure or chassis, and in particular to an enclosure having an adaptable mounting system for accepting cards in a number of standard dimensions independent of slot location.

BACKGROUND OF THE INVENTION

ANSI/IEEE Standards regulate the accepted dimensions, for example, length and depth, for all VME type electronic circuit cards utilized with standard communications backplanes. VME type circuit cards are generally provided in lengths that depend on the number of attached connectors for interfacing with the backplane. For example, a circuit card of length 3 U has one backplane connector. Cards of lengths 6 U and 9 U have two and three backplane connectors, respectively. Circuit cards are also provided in a number of standard depths. Two of the most popular depths are 160 mm and 220 mm, but other depths, both shorter and taller, are commercially available.

VME cards are typically installed in system chassis enclosures by inserting the edges of the cards in opposed card guides mounted to the enclosure walls. Mounted to each card guide are a number of guide slots corresponding to slot locations for the backplane that accept and retain the card edges. Installation of each circuit card is completed by inserting the attached card connector into a mating connector on the backplane. Through the connector and backplane, each installed VME circuit card may communicate with other installed VME cards and the electronic system.

Historically, prior art card guides mounted within system chassis enclosures have only been able to accommodate one depth per slot location. Furthermore, the system chassis was designed to segregate slot locations for circuit cards of different lengths into different designated areas of the chassis enclosure through the use of fixed partitions. These partitions were also used, where necessary, to separate slot locations for circuit cards of different depths. Thus, circuit card slot locations within the enclosure were inflexibly dedicated at the time the system chassis and circuit board configuration was first designed.

The disadvantage of the prior art system chassis design and card guide mounting system is that the number of slots chosen for a given dimension circuit card in a designated partitioned area is fixed for the life of the chassis. Furthermore, the slot location chosen for a particular dimension and function circuit card is also fixed. In this manner, the chassis enclosure for the electronic system is limited in available expansion area and unable to adapt to replacement or modified circuit designs implemented on circuit cards having dimensions different than the original design. The inability to adapt to or accommodate redesigned circuit cards of other standard dimensions regardless of slot location severely limits the life span of the enclosure. This often necessitates complete enclosure replacement at considerable cost to accommodate subsequent updated or redesigned versions of the electronic system.

Accordingly, there is a need for an adaptable mounting system for electronic circuit card enclosures capable of accepting for installation cards of varying standard dimensions regardless of slot location. With such a system, modifications or redesigns of individual circuit cards may be implemented without additionally requiring the chassis enclosure to be redesigned.

SUMMARY OF THE INVENTION

The foregoing problems associated with prior art circuit card mounting enclosures are addressed by the adaptable electric circuit card mounting system of the present invention. In accordance with the invention, three types of card guides are provided to be mounted within the circuit card chassis enclosure. These card guides enable circuit cards of varying standard dimensions to be installed within the enclosure independent of slot location. Adaptability of the chassis to variations in chosen card dimension obviates the need to redesign or modify the chassis of accommodate a modification to the system requiring a circuit card having a different dimension.

In particular, two of the card guides are mounted to the enclosure chassis walls at opposite ends of the defined slot locations for installing circuit cards. Each of the first two guides are designed to accept cards having different standard depths. For example, the first card guide accommodates circuit cards having a depth of 160 mm. The second card guide is mounted in conjunction with the first card guide to accommodate circuit cards having a depth of 220 mm. These first two card guides are also positioned within the enclosure chassis to accommodate circuit cards of a given length, for example, 9 U.

A third type of card guide is selectively installed between the enclosure walls and the first two card guides, perpendicular to the card slots to enable cards of different standard lengths to be installed. In the prior art enclosures, a fixed partition within the enclosure effectively segregated cards of different lengths into different areas. The third type of card guide as utilized in the present invention functions as an adaptable partition that may be selectively installed at any slot location to enable cards of different standard lengths to be installed. Because the partition may be selectively installed at particular slot locations, cards of two different standard dimension can be installed next to each other. Adjacent installation of different dimension cards was not possible with the prior art enclosures utilizing fixed partitions.

BRIEF DESCRIPTION OF THE DRAWINGS

A more complete understanding of the adaptable card mounting system of the present invention may be had by reference to the following Detailed Description when taken in conjunction with the accompanying Drawings, wherein:

FIG. 2 is a top view of the enclosure chassis for incorporating the adaptable card mounting system of the present invention;

FIGS. 3A-3D show the card guides utilized by the adaptable card mounting system of the present invention;

DETAILED DESCRIPTION OF THE DRAWINGS

Figure 1:
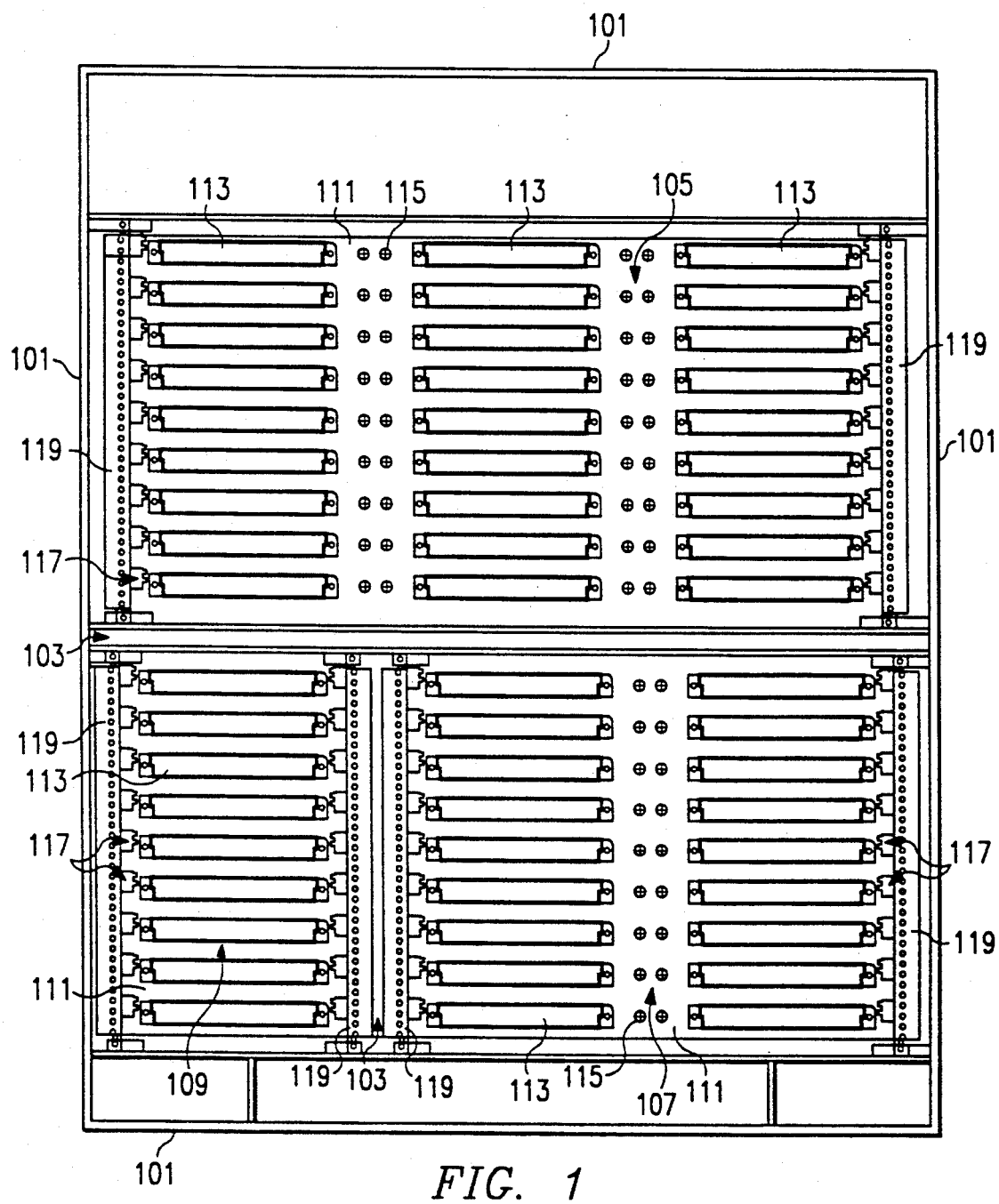
FIG. 1 is a top view of a prior art enclosure chassis having segregated areas for accommodating cards of varying dimensions.

Referring now to FIG. 1, there is shown a prior art enclosure chassis 101 utilizing fixed partitions 103 to segregate areas, 105, 107 and 109, for circuit cards (not shown) of varying dimensions. Each area has a backplane 111 that is interconnected with the other backplanes to enable communication between circuit card areas 105, 107 and 109. The backplane 111 also allows for circuit cards within each area 105, 107 and 109 to be in communication with cards in the same area. Backplane connectors 113 mounted to the backplane 111 are provided to couple the backplane to each installed circuit card. The backplane is mounted to the chassis 101 by means of mounting screws 115.

As illustrated in FIG. 1, the segregated circuit card areas, 105, 107 and 109, are designed to only accommodate circuit cards of certain fixed dimensions. For example, area 105 comprises a backplane 111 having three consecutive connectors 113 per slot location 117. This particular configuration accommodates a standard 9 U VME circuit card. Areas 107 and 109 accommodate standard 6 U and 3 U VME circuit cards respectively. The card dimensions that each segregated area, 105, 107 and 109, may accommodate and the number of slots 117 per area are fixed by the design of the prior art chassis 101.

Modifications o additions to the circuit design are typically implemented by changing the number and type of circuit cards to be installed in each area 105, 107 and 109 of the chassis 101. Because of built in space limitations resulting from having fixed partitions and segregated card areas, it may be impossible to fully implement the new design incorporating card length changes on the prior chassis 101 Furthermore, the card depth accommodated by each area, 105, 107 and 109, is also fixed by the use of standard card guides 119. Thus any new circuits fabricated on cards having different dimensions, either length or depth, cannot be accommodated on the prior art chassis 101 without a major redesign of the backplane connections and possibly the chassis design.

Each card guide 119 is specifically designed to accommodate a circuit card of a given depth. Once mounted within the chassis 101 at a fixed distance, the prior art card guides 119 are not adjustable to handle different card lengths without substantially modifying the chassis itself. Thus, the chassis 101 has a usable life span limited by any future modifications in the number and type of included circuit cards required by the system design.

Referring now to FIG. 2, there is shown a top view of an enclosure chassis 201 for mounting the adaptable card mounting system of the present invention. Chassis 201 is similar to chassis 101 of FIG. 1 (rotated 90° on the page) in that both support a backplane 111 or 203, respectively, for installing circuit cards. Backplane 203 allows for installed circuit cards to be in communication through backplane connectors 205 mounted thereto. Screws 207 attach the backplane 203 to the chassis 201. Also mounted to the chassis 201 are a number of rails 209 that are attached to the end walls of the chassis 201 and a center partition 210. Rails 209 extend in a vertical direction along the end walls and the center partition 210 from the bottom of the chassis 201 to its top. A lower support bar 211 is attached to the backplane 203 through a set of screws 213. Lower support bar 211 and rails 209 function in a manner to be described to mount and secure the adaptable card mounting system of the present invention to the chassis 201.

Figure 3B:
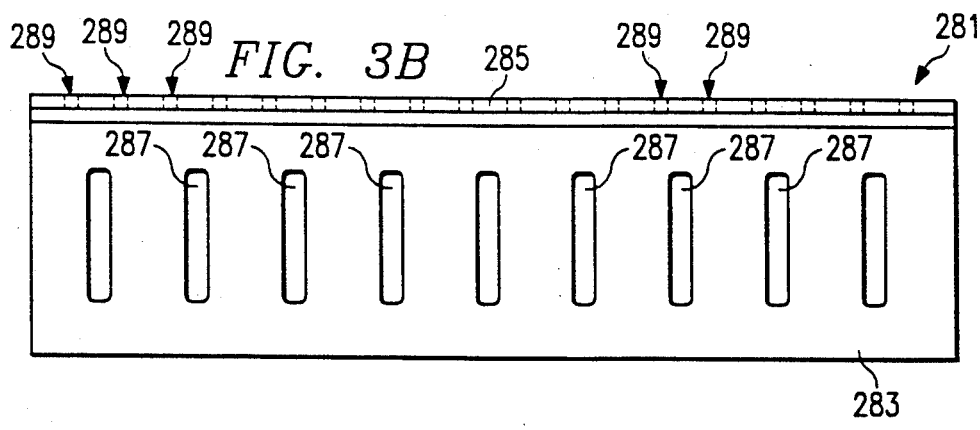

Referring now to FIGS. 2 and 3A–3D, there are shown, in FIGS. 3A–3D, the adaptable card guides for mounting to the chassis 201, lower support bar 211 and rails 207. These adaptable card guides enable the chassis 201 to accommodate cards of varying dimensions. FIG. 3A shows a first card guide 251 to be mounted to the side walls of the chassis 201 utilizing the rails 209 in a manner to be described. Card guide 251 is comprised of a mounting plate 253, card slots 255 and a circuit card mounting bracket 257 at a right angle to the plate 253. Each card slot 255 is fastened to the mounting plate 253 by fasteners 259. Ventilation openings 261 are also provided in the mounting plate to facilitate air flow past circuit cards installed in the card slots 255. Mounting bracket 257 is attached to or is an integral part of the mounting plate 253. Mounting holes 263 in the bracket 257 accept mounting screws to secure circuit cards installed in the card slot. Card guide 251 is configured to accept circuit cards of a first depth as defined by the position of mounting bracket 257.

FIG. 3B shows a second circuit card guide 281 to be mounted to the side walls of chassis 201 utilizing the rails 209 in a manner to be described. Card guide 281 is comprised of mounting plate 283 and a mounting bracket 285 similar in design and function to bracket 257 illustrated in FIG. 3A. Ventilation openings 287 are provided in the mounting plate 283 to facilitate air flow past circuit cards installed in the chassis 201. Mounting bracket 285 is attached to mounting plate 283. Mounting holes 289 in the bracket 257 accept mounting screws to secure circuit cards installed in the card slot. Card guide 281 is mounted to the chassis 201 above the card guide 251. When mounted in this manner, card guide 281 in conjunction with card guide 251 enables the chassis 201 to accept circuit cards of a second depth as defined by the position of mounting bracket 285.

FIGS. 3C and 3D show two more card guides 301 and 303 respectively to be mounted to the lower support bar 211 in a manner to be described. When mounted to the lower support bar 211, card guides 301 and 303 function as individual slot partitions that permit selective installation of cards of different length. These partitions enable available slot length to be individually and selectively adjusted for each slot location. Each guide 301 and 303 is comprised of a mounting plate 305, a card slot 307 and a mounting bracket 309. Each card slot 307 is affixed to the mounting plate 305 by fasteners 306. Mounting bracket 309 is attached to or is a integral part of mounting plate 305 and is at a right angle to the plate. Mounting holes 311 are formed in the bracket 309 to accept mounting screws to secure circuit cards of a given depth installed in the card slot 307. The only difference between guides 301 and 303 is the positioning of the brackets 309. Card guide 303 has a bracket position equal to bracket 257 of FIG. 3A. Thus, when a circuit card having that depth is installed, guide 303 must be used. Similarly, guides 301 and 281 have brackets, 309 and 285, respectively, having positions that are equal.

Figure 4:
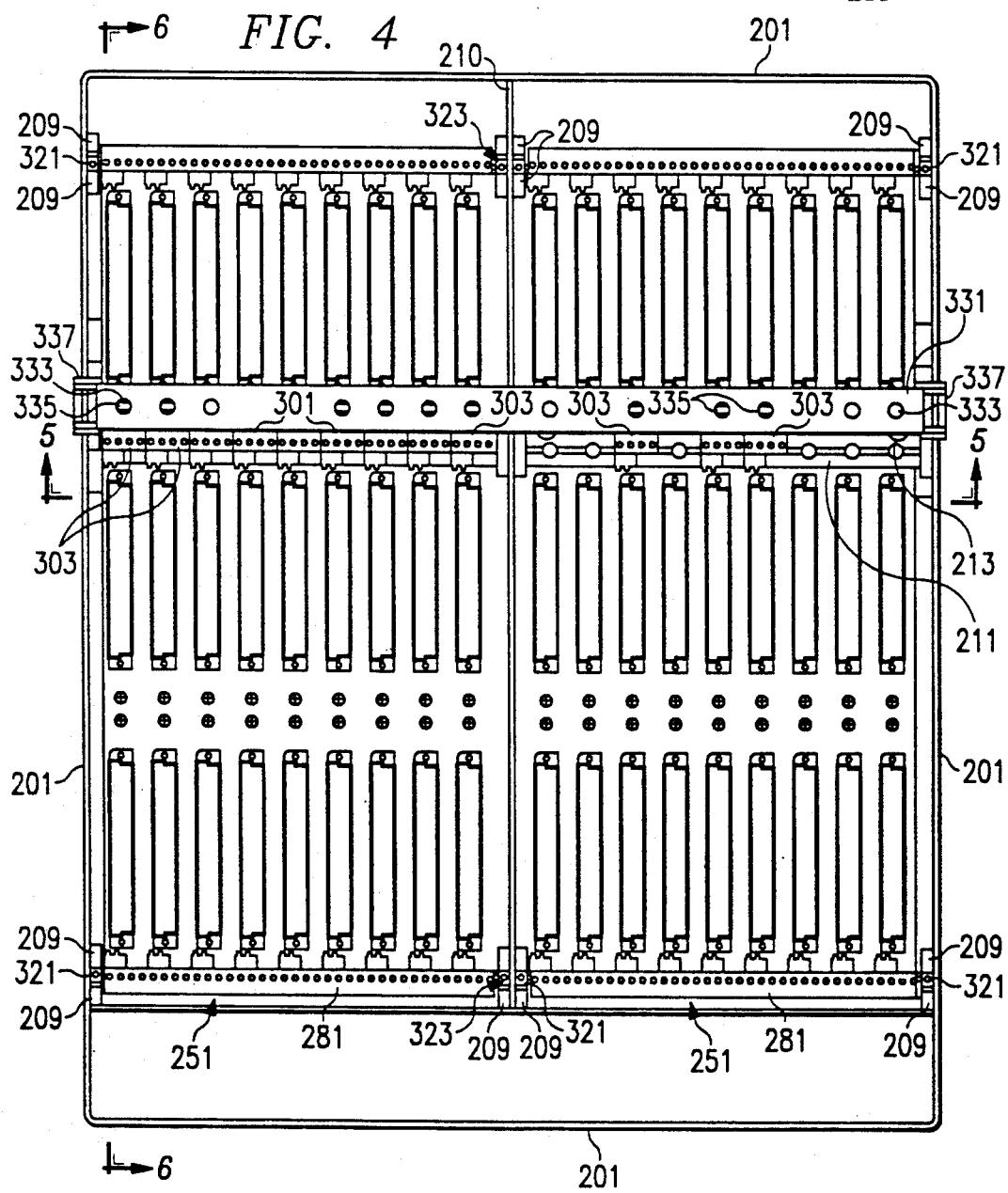
FIG. 4 is a top view of an enclosure chassis incorporating the mounting system of the present invention for installing cards of varying dimensions.

Referring now to FIGS. 2-4, there is shown in FIG. 4 the chassis 201 of FIG. 2 with the adaptable circuit card mounting system (FIGS. 3A-3D) of the present invention installed therein. As illustrated, card guides 251 and 281 are mounted to the side walls of the chassis 201 by means of the rails 209. Wedge lock retainers 321 of a known design are mounted to the ends of the mounting plates 253 and 283 for card guides 251 and 281 and inserted in the space 323 between adjacent rails 209. When tightened, the wedge lock retainers 321 secure guides 251 and 281 to the chassis 201.

To mount card guides 301 and 303 to the chassis 201, tab 325, see FIGS. 3C and 3D, is inserted in the openings 327 and slots 329 of the lower support bar 211. Using both openings 327 and the slots 329 prevents the mounted card guides 301 or 303 from rotating or shifting. An upper support bar 331 is then placed over the mounted card guides 301 and 303 to secure the guides to the chassis 201. Openings 333 in the upper support bar 331 accept tabs 335, see FIGS. 3C and 3D, on the guides 301 and 303. A latch 337 on either side of the bar 331 secures the upper support bar 331 to the side walls of the chassis 201.

As configured in FIG. 4 the chassis 201 will accept cards of various depths as determined by the location of the card guides 301 and 303. With reference to the lower left quadrant of the chassis 201 as shown in FIG. 4, this quadrant is configured to accept either 6 U 160 mm depth cards or 6 U 220 mm depth cards depending on the location of the card guides 301 and 303. Since all available slots in the lower left quadrant contain either a card guide 301 or a card guide 303 the upper left hand quadrant of the chassis 201 may be configured to accept either 3 U 160 mm depth cards or 3 U 220 mm depth cards.

With reference to the right side of the chassis 201 from center partition 210, the lower right quadrant is configured to accept either 6 U 160 mm depth cards at the slot locations where the card guides 303 are mounted or accept 9 U 160 mm dept cards or 9 U 220 mm depth cards in the remaining slots to the right of the center partition 210. This illustrates the versatility of the card mounting system of the present invention. Further, by removing any of the card guides 301 or 303 or by adding additional card guides the card configuration is modifiable from that illustrated in FIG. 4.

Figure 5:
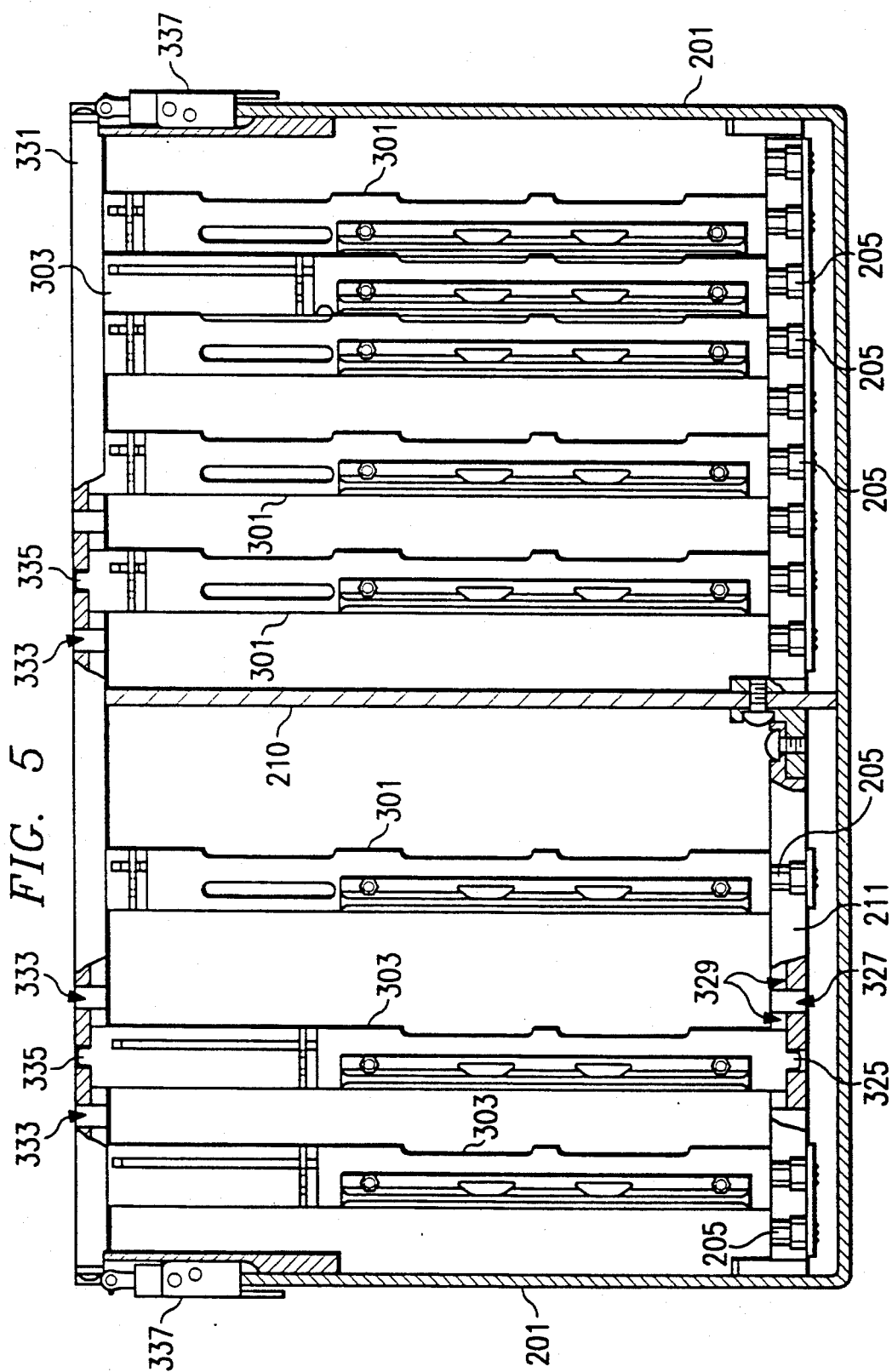
FIG. 5 is a front cross-sectional view of the enclosure shown in FIG. 4 taken along line 5—5 showing the card guides for installing cards of varying dimensions.

Referring to FIG. 5 there is shown a cross section of the chassis 201 to further illustrate the mounting of the card guides 301 and 303 in the chassis. To the left of the center partition 210 there is illustrated the installation of two card guides 303 and one card guide 301. To the right of the center partition 210 there is illustrated the installation of four card guides 301 and one card guide 303.

As illustrated in FIG. 5 the upper support bar 331 is cut away to illustrate the insertion of the tab 335 into the opening 333. Also shown in greater detail is means for securing the upper support bar 331 to the side walls of the chassis 201 by means of a latch 337. Also shown cut away in FIG. 5 is the lower support bar 211 to illustrate the insertion of the tabs 325 into the openings 327 and the slot 329.

Although FIG. 5 is a section taken along line 5—5 of FIG. 4 it will be noted that the arrangement of the card guides 301 and 303 is not the same in both figures. This difference in the location of the card guides is intended to illustrate the versatility of the card mounting system of the present invention. As illustrated in FIG. 5 where the card guides 303 are shown, the system accommodates 6 U 160 mm depth cards. Where the card guide 301 is shown in FIG. 5, the system accommodates 6 U 220 mm depth cards. Again, to change the configuration it is only necessary to add or remove card guides 301 or 303.

Figure 6:
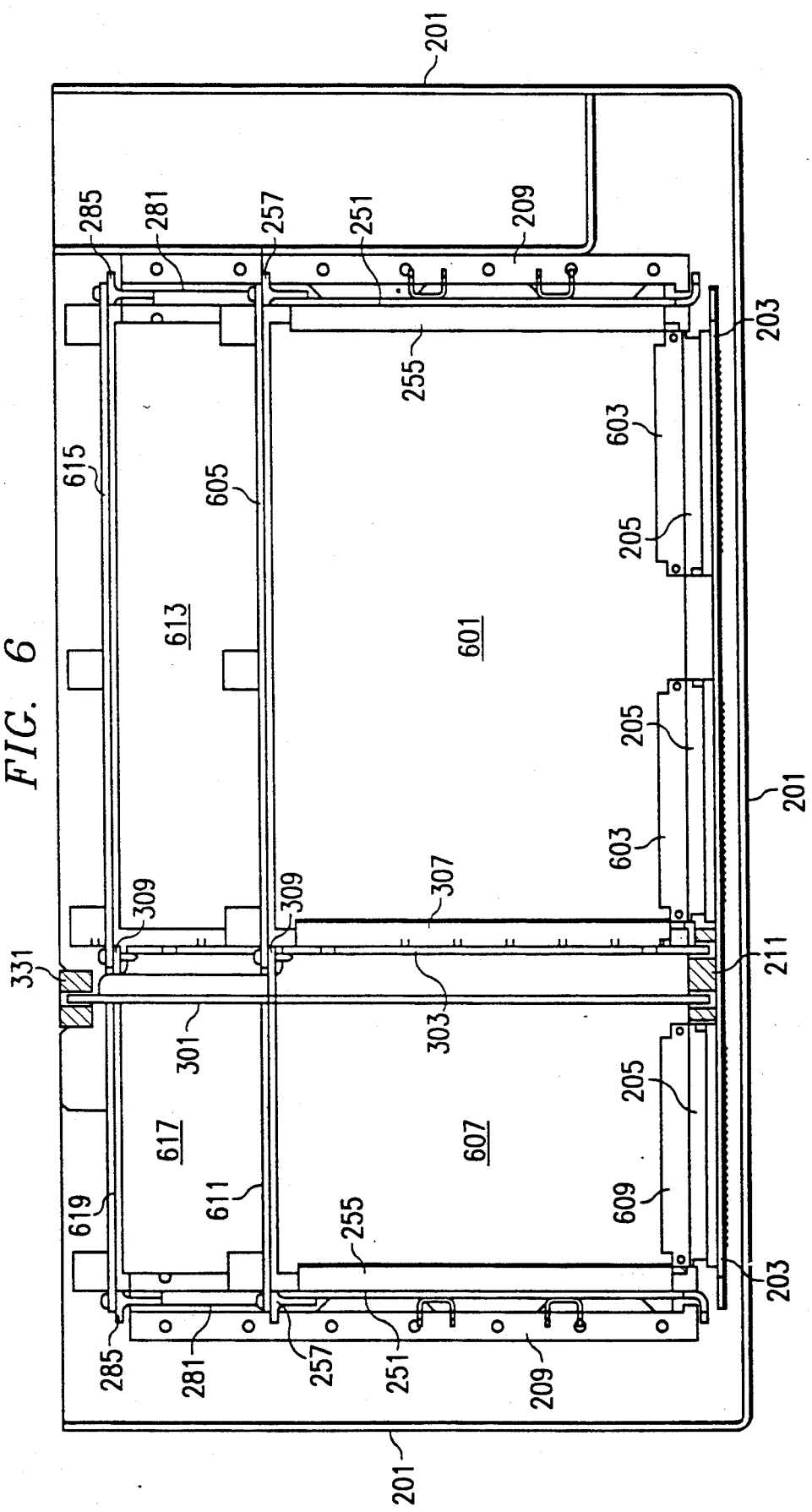
FIG. 6 is a side cross-sectional view of the enclosure shown in FIG. 4 taken along line 6—6 with cards of varying dimensions shown installed.

Referring now to FIG. 6, there is illustrated the installation of cards of varying sizes using the card mounting system of the present invention. This FIGURE is a cross section taken along the line 6—6 of FIG. 4. Card 601 is closest to the observer and shows the installation of a 6 U 160 mm depth card between a card guide 251 on the right and a card guide 303 on the left. Card 601 is supported in the chassis 201 by card slot 255 on the right and card slot 307 on the left. Two connectors 603 are in engagement with connectors 205 of the backplane 203. The card 601 is secured in place by means of a mounting plate 605 fastened to the top of the card and bolted to the bracket 257 on the right and the bracket 309 on the left.

Mounted behind the card 601 and next removed from the viewer is a card 607 that is a 9 U 160 mm depth card that extends from the card guide 251 on the left to the card guide 251 on the right. The card 607 shows one connector 609 engaging a connector 205 of the backplane 203. However, the card 607 may include one or two additional connectors 609 that are hidden from view behind the card 601. The card 607 is inserted in card slots 255 at both the left edge and the right edge (the latter not shown as it is hidden from view behind the card 601). Holding the card 607 in place is a mounting plate 611 fastened to the top of the card and bolted on the right to the bracket 257 (now shown) and bolted on the left to the bracket 257.

Next removed from the viewer and mounted behind both cards 601 and 607 is a 6 U 220 mm depth card 613. This card is supported on the right by the card guide 281 mounted above a card guide 251 and on the left by card guide 301. The card slots supporting the card 613 are not visible in FIG. 6. However, on the right the card 613 is supported in a card slot 255 and on the left it is supported by a card slot 307. Either one or two connectors are mounted to the card 613 to engage connectors 205 of the backplane 203. To secure the card 613 in place in the chassis 201 a mounting plate 615 is fastened to the top of the card and bolted to the bracket 285 on the right and the bracket 309 on the left.

Also shown in FIG. 6 mounted in the chassis 201 is a 9 U 220 mm depth card 617 mounted next removed from the viewer behind the cards 601, 607 and 613. Card 617 is supported on the right by the card guide 281 mounted above a card guide 251 and on the left also by a card guide 281 mounted above a card guide 251. The card is supported in place between card slots 255 on both sides. A 9 U 220 mm depth card may have up to three connectors for engagement with the connectors 205 of the backplane 203. To secure the card 617 in place in the chassis 201 a mounting plate 619 fastened to the top of the card is bolted on the right to the bracket 285 and on the left also to a bracket 285.

Although FIG. 6 is a cross section taken along line 6—6 of FIG. 4 there is illustrated an arrangement of mounted cards not shown in FIG. 4. Again, this shows the versatility of the card mounting system of the present invention to accept cards of different sizes and depths.

Although a preferred embodiment of the invention has been illustrated in the accompanying drawings and described in the foregoing detailed description, it will be understood that the invention is not limited to the embodiment disclosed but is capable of numerous rearrangements and modifications of parts and elements without departing from the scope of the invention as set forth in the following claims.

I claim:

1. A mounting system for supporting electronic circuit cards of varying sizes by selective configuration of slot location in a chassis having a plurality of defined slot locations for supporting installed cards, comprising:
   first means mounted within the chassis for supporting an electronic circuit card of a first length and first depth at any slot location;
   second means mounted at selected slot locations in said chassis for supporting an electronic circuit card of a second length shorter than the first length at any selected slot location; and
   mounting means fastened within the chassis for detachably mounting, at any selected slot location, said second means thereby forming a slot partition at each selected slot location to enable electronic circuit cards having different lengths to be supported.

2. The mounting system as in claim 1 further comprising third means mounted in the chassis for installing a card of a second depth greater than the first depth at any slot location.

3. The mounting system as in claim 2 wherein the third means comprises opposed card guides mounted to the chassis walls on opposed ends of the plurality of slot locations.

4. The mounting system as in claim 3 wherein each of the opposed card guides comprises:
   a guide plate mounted to the chassis; and
   means fastened to the guide plate at a position corresponding to the second depth to receive a mounting plate attached to an upper edge of each installed card of a second depth for securing said card within the chassis.

5. The mounting system as in claim 1 wherein the first means comprises opposed first card guides mounted to the chassis on opposed ends of the plurality of slot locations.

6. The mounting system as in claim 5 wherein each of the opposed first card guides comprises:
   a guide plate mounted to the chassis;
   a plurality of edge slot means fastened to the guide plate, each edge slot means corresponding to one of the plurality of card slots for accepting an edge of an installed card; and
   means fastened to the guide plate at a position corresponding to the first depth to receive a mounting plate attached to an upper edge of each installed card of a first depth for securing said card within the chassis.

7. The mounting system as in claim 1 wherein the second means comprises a single slot card guide detachably mounted at selected individual slot locations to form a slot partition.

8. The mounting system as in claim 7 wherein the single slot card guide comprises:
   a single slot guide plate having means for engaging said mounting means for detachably mounting the single slot card guide at the specified slot location;
   an edge slot means fastened to the single slot plate for accepting an edge of an installed card of a second length; and
   means fastened to the single slot plate at a position corresponding to the depth of the installed card to receive a mounting plate attached to an upper edge of each installed card of a second length for securing said card within the chassis.

9. The mounting system as in claim 1 wherein said mounting means comprises:
   a lower support bar fastened to the chassis for mounting at each selected slot location a lower end of said second means; and
   an upper support bar aligned with the lower support bar and detachably secured to the chassis for accepting an upper end of said second means for mounting within the chassis at the selected individual slot locations.

10. An adaptable mounting system for supporting electronic circuit cards of various dimensions in adjacent card slots within a card enclosure having defined therein a plurality of parallel, adjacent cards slots for receiving electronic circuit cards, comprising:
    support means within the card enclosure for supporting thereon a plurality of connector means for matingly connecting with an installed card, the plurality of connector means defining, within the card enclosure, a plurality of parallel, adjacent card slots for receiving installed cards;
    an opposed pair of first card edge guides mounted to the card enclosure on opposed ends of the defined plurality of card slots for accepting opposed side edges of cards of a first length and first depth installed in the plurality of card slots;
    at least one second card edge guide mounted within the card enclosure between the opposed pair of first card edge guides at a selected card slot for accepting, in conjunction with one of said opposed first card edge guides, opposed side edges of an installed card of a second length shorter than the first length; and
    means within the card enclosure for detachably mounting second card edge guides at any selected card slot of the plurality of card slots to form a slot partition.

11. The adaptable mounting system as in claim 10 wherein the enclosure further includes card support means supported within the card enclosure having a plurality of connecting members arranged in parallel rows defining the plurality of parallel card slots, each connecting member matingly accepting a corresponding mating connecting member mounted to an edge of each installed card.

12. The adaptable mounting system as in claim 11 wherein each guide of the opposed pair of first card edge guides comprises:
    a guide plate;
    a plurality of edge slot means fastened to the guide plate, each edge slot means corresponding to one of the plurality of card slots for accepting the edge of an installed card; and
    means fastened to the guide plate at a position corresponding to the first depth to receive a mounting plate attached to an upper edge of each installed card of the first depth for securing said card within the card enclosure.

13. The adaptable mounting system as in claim 10 wherein each second card edge guide comprises:
    a guide plate having a first tab on a top edge thereof and a second tab on a bottom edge thereof, the first and second tabs engaging said means for detachably mounting to secure the guide plate at the selected card slot;

edge slot means fastened to the guide plate for accepting the edge of an installed card of a second depth; and means fastened to the guide plate at a position corresponding to the second depth to receive a mounting plate attached to an upper edge of each installed card of a second length and second depth for securing said card with the card enclosure.

14. The adaptable mounting system as in claim 13 wherein the means for detachably mounting comprises:

a lower support bar fastened to the support means at a position between the opposed pair of first card edge guides, said lower support bar having openings at each card slot for accepting the second tab on the guide pate; and an upper support bar detachably mounted to the card enclosure between the opposed first card edge guides above and parallel to the lower support bar, said upper support bar having openings at each card slot for accepting the first tab on the guide plate.

15. The adaptable mounting system as in claim 10 further including an opposed pair of third card edge guides mounted to the card enclosure on the opposed ends of the defined plurality of card slots above the opposed pair of first card edge guides for installing a card of the first length and a second depth greater than the first depth.

16. The adaptable mounting system as in claim 15 wherein each of the opposed third card edge guides comprises:

a guide plate; and means fastened to the guide plate at a position corresponding to the second depth to receive a mounting plate attached to an upper edge of each installed card of a second depth for securing said card with the card enclosure.

17. The adaptable mounting system as in claim 16 further comprising a fourth card edge guide mounted within the card enclosure between the opposed first and third card edge guides at a selected card slot for accepting, in conjunction with one of said opposed third card edge guides, opposed side edges of an installed card of the second length and second depth.

18. The adaptable mounting system as in claim 17 wherein the fourth card edge guide comprises:

a guide plate having a first tab on a top edge thereof and a second tab on a bottom edge thereof, the first and second tabs engaging said means for detachably mounting to secure the guide plate at the selected card slot; and means fastened to the guide plate at a position corresponding to the second depth to receive a mounting plate attached to an upper edge of each installed card of a second depth and second length for securing said card within the card enclosure.

19. An adaptable card mounting system installed within a circuit card chassis to enable the mounting therein of circuit cards of various dimensions, comprising:

a backplane fastened to the chassis having a plurality of parallel rows of electrical connectors, each row defining a slot location for accepting a circuit card, each card having at least one electrical connector for mating with the connectors of the backplane when the circuit card is mounted within the chassis;

an opposed pair of first card guides detachably mounted to the chassis on opposed ends of the plurality of parallel slot locations, each first card guide having a plurality of card edge slots, each card edge slot positioned to accept a side edge of a circuit card of a first length and first depth mounted in a slot location;

an opposed pair of second card guides detachably mounted to the chassis on opposed ends of the plurality of parallel slot locations to accept a circuit card of a first length and second depth taller than the first depth;

at least one third card guide detachably mounted within the chassis between the opposed pairs of first and second card edge guides to form a partition at a selected slot location, each third card guide having a card edge slot positioned to accept a side edge of a circuit card of a second length shorter than the first length mounted in the partitioned slot location;

means for detachably mounting third card guides at selected slot locations;

means positioned on the first card guide at a position corresponding to the first depth to receive a mounting plate attached to an upper edge of each mounted card of the first depth for securing said card within the chassis;

means positioned on the second card guide at a depth corresponding to the second depth to receive a mounting plate attached to an upper edge of each mounted card of the second depth for securing said card within the chassis; and means positioned on the third card guide at a position corresponding to the depth of the card mounted in the selected slot location to receive a mounting plate attached to an upper edge of the mounted card for securing said card within the chassis.

20. The adaptable card mounting system as in claim 19 wherein the means positioned on the third card guide is positioned at a depth corresponding to the first depth to secure, in conjunction with the means for securing on the first card guide, a mounted card of the first depth and second length.

21. The adaptable card mounting system as in claim 19 wherein the means positioned on the third card guide is positioned at a depth corresponding to the second depth to secure, in conjunction with the means for securing on the second card guide, a mounted card of the second depth and second length.

22. The adaptable card mounting system as in claim 19 wherein the means for detachably mounting comprises:

means fastened to the backplane between the opposed first and second card edge guides for detachably mounting a bottom portion of the third card guide at any selected slot location; and means detachably fastened to the chassis above the means fastened to the backplane for detachably mounting a top portion of the third card guide at any selected slot location.

23. The adaptable card mounting system as in claim 22 wherein the means fastened to the backplane comprises a lower support bar positioned between the opposed pairs of first and second card edge guides and having openings at each card slot for accepting a tab on the bottom portion of the third card edge guide for detachably mounting the third card edge guide in the chassis.

24. The adaptable card mounting system as in claim 23 wherein the means detachably fastened to the chassis comprises an upper support bar positioned between the opposed pairs of first and second card edge guides above and parallel to the lower support bar and having openings at each card slot for accepting a tab on the top portion of the third card edge guide for detachably mounting the third card edge guide in the chassis.

25. The adaptable card mounting system as in claim 19 wherein the first depth is approximately 160 mm, the second depth is approximately 220 mm, the first length accepts a standard 9 U VME circuit card and the second length accepts a standard 6 U VME circuit card.

* * * * *

UNITED STATES PATENT AND TRADEMARK OFFICE
CERTIFICATE OF CORRECTION

PATENT NO. : 5,172,306
DATED : December 15, 1992
INVENTOR(S) : Gregory A. Cantrell It is certified that error appears in the above-identified patent and that said Letters Patent is hereby corrected as shown below:

Col. 3, line 35, change "o" to --or--;
Col. 3, line 42, insert period after "101";
Col. 4, line 57, change "a" to --an--;
Col. 9, line 17, change "pate" to --plate--.

Signed and Sealed this

Nineteenth Day of April, 1994

Attest:

BRUCE LEHMAN

Attesting Officer

Commissioner of Patents and Trademarks